Jan. 23, 1962 M. B. HERSCHER 3,018,389

DELAY CIRCUIT USING MAGNETIC CORES AND TRANSISTOR STORAGE DEVICES

Filed June 3, 1958 2 Sheets-Sheet 1

INVENTOR.
MARVIN B. HERSCHER

BY Morris L. Rabkin

ATTORNEY

INVENTOR.
MARVIN B. HERSCHER
BY Morris A. Rabkin
ATTORNEY 3,018,389

DELAY CIRCUIT USING MAGNETIC CORES AND TRANSISTOR STORAGE DEVICES

Marvin B. Herscher, Philadelphia, Pa., assignor to Radio Corporation of America, a corporation of Delaware Filed June 3, 1958, Ser. No. 739,616
11 Claims. (Cl. 307—88.5)

This invention relates to delay circuits, and particularly to delay circuits of the magnetic core, transistor type.

Delay circuits are useful in applications where it is desired to provide one or more output signals, each occurring a known time after an input signal has been received. Delay circuits may be used, for example, in sequential gating applications, in timing applications such as ring counter type circuits, in switching applications, and so on. Magnetic core, transistor circuits connected in regenerative fashion are used in storage and shifting applications in the prior art. These magnetic core, transistor circuits provide square-wave output signals and require relatively small operating power compared to certain prior art circuits used for similar purposes.

It is an object of the present invention to provide improved delay circuits of the magnetic core, transistor type.

Another object of the present invention is to provide improved delay circuits of the magnetic core, transistor type wherein the position of the output signals may be varied in a desired manner.

Another object of the present invention is to provide improved delay circuits of the magnetic core, transistor type wherein the duration and occurrence of the various output signals may be controlled in a simple and effiicient manner.

According to the present invention, a delay circuit includes a plurality of magnetic core, transistor circuits interconnected with each other. Means are provided to control the storage times of the various transistors to thereby control the spacings and durations of the various output signals produced by the circuit.

Figures 1, 2, 3, 4, 5:
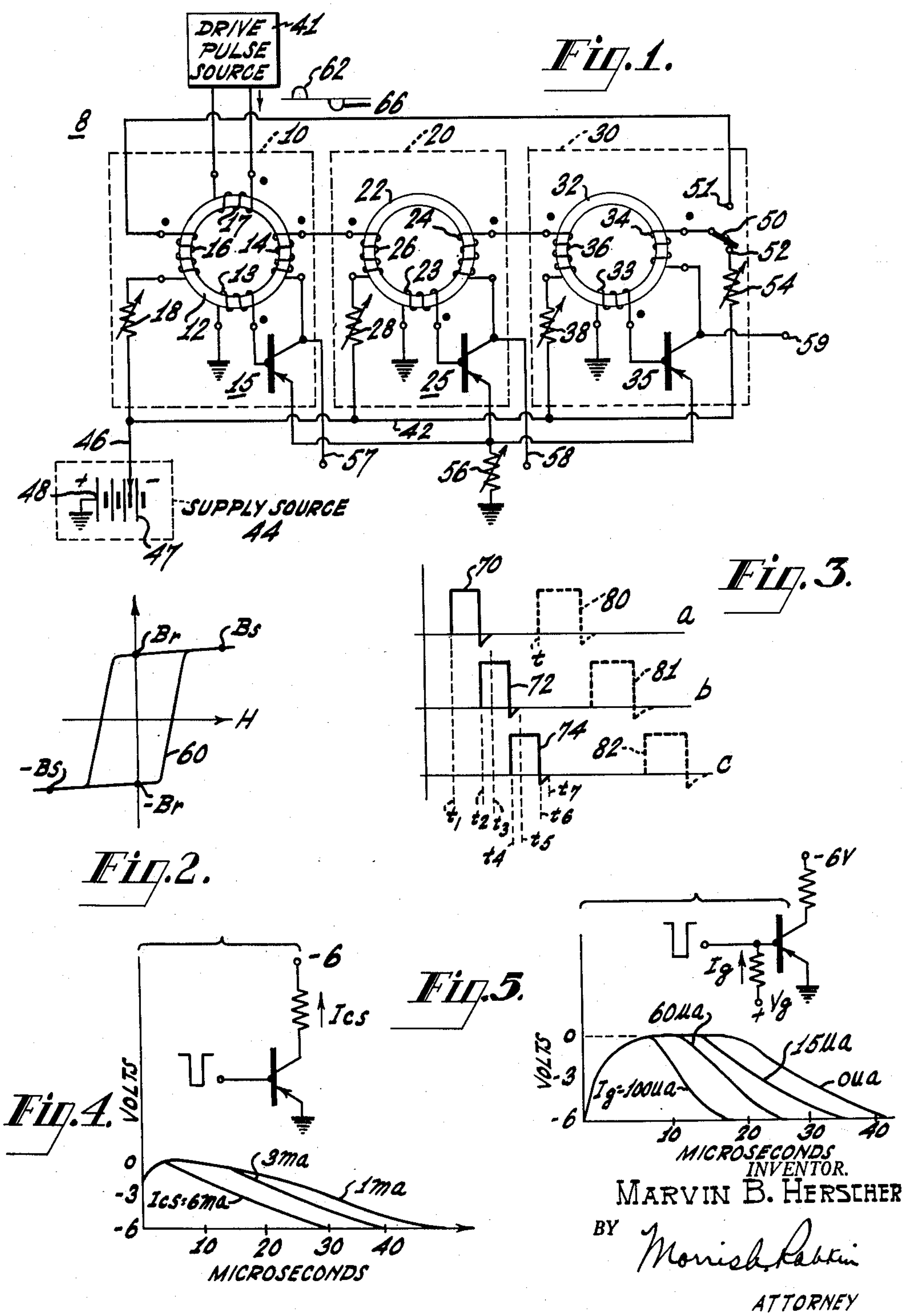
FIG. 1 is a schematic diagram of a delay circuit according to the invention.
FIG. 2 is a graph of a hysteresis characteristic for any of the magnetic cores of the circuit of FIG. 1.
FIG. 3 is a timing diagram useful in explaining the operation of the circuit of FIG. 1.
FIGS. 4 and 5 are each graphs showing the effects on the storage characteristics of the transistors of the circuit of FIG. 1 using different collector currents and different amounts of reverse bias, respectively.

The delay circuit 8 of FIG. 1, for example, has three separate stages 10, 20 and 30 connected to each other in ordered fashion. Each stage is similar to the other. Thus, only the first stage 10 is described in detail. Corresponding elements in the three stages 10, 20 and 30 are designated by reference numerals having the same units digit; the numerals between 10 and 20 are used for the stage 10 elements, the numerals between 20 and 30 are used for the stage 20 elements, and the numerals between 30 and 40 are used for the stage 30 elements. Stage 10 includes a magnetic core 12 of rectangular hysteresis loop material having four windings thereon. First and second of the windings are the base and collector windings 13 and 14 of a transistor 15 of the stage 10. The base and emitter windings 13 and 14 are coupled respectively to the base and collector electrodes of a transistor 15 which may be of the PNP type. The third winding 16 of the core 12 is used as an input winding when the delay circuit is used in ring counter type applications. The fourth winding of the core 12 is another input winding 17 used for receiving input pulses from a drive pulse source 41. The fourth input winding 17 is not required in succeeding ones of the stages 20 and 30.

The sense of linkage of the various windings to the core 12 is indicated in the drawing by the conventional dot notation. Positive (conventional) current flow into the dot marked terminal of a winding causes a voltage to be induced in each of the other windings linked to the core 12 in a direction to make the dot marked terminal of any other winding positive relative to the unmarked terminal of that other winding. The induced voltage may be relatively large or relatively small in amplitude, as described more fully hereinafter. The dot terminal of the base winding 13 is connected to the base electrode of the transistor 15. The unmarked terminal of the base winding 13 is connected to a common point of reference potential, indicated in the drawing by the conventional ground symbol. The dot terminal of the collector winding 14 is directly connected to the dot terminal of the input winding 26 of the second stage core 22. The unmarked terminal of the input winding 16 of the core 12 is connected in series with a collector resistor 18 to a supply bus 42. The supply bus 42 is connected to a source 44 of variable supply potential as by connecting the supply bus 42 to a tap 46 of a battery 47. The positive terminal 48 of the battery 47 is connected to the common ground.

The dot terminal of the input winding 16 is connected to the upper fixed terminal 51 of a single-pole, double-throw switch 50. The arm of the switch 50 is connected to the dot terminal of the collector winding 34 of the last stage 30 of the delay circuit. The movable arm of the switch 50 is normally connected to the lower fixed terminal 52 except in ring counter type operations, more fully described hereinafter. The lower fixed terminal 52 of the switch 50 is connected in series with a collector resistor 54 to the output of the supply source 44.

All the emitter electrodes of the transistors 15, 25 and 35 are connected in series with a common emitter resistor 56 to ground. The collector resistors 18, 28, 38 and 54 may be variable resistors, as shown, or fixed resistors. Also, the common emitter resistor 56 may be variable, as shown, or fixed. The output signals of the delay circuit may be taken across the output terminal 59 connected between the collector electrode of the stage 40 transistor 35 and ground. If desired, parallel outputs may be taken by providing separate output leads 57, 58 and 59 each connected to the collector electrodes of a different one of the transistors 15, 25 and 35. Parallel outputs are useful in commutating type applications or in gating type applications.

In operation, each of the cores 12, 22 and 32 is at one of its two remanent states. Each of the transistors 15, 25 and 35 is biased to its cut-off condition. For example, the reset state of a core is arbitrarily represented by the point —B*r* of the hysteresis characteristic 60 of FIG. 2. A core may be changed from its reset condition —B*r* to its set condition represented by the remanent point B*r* of the curve 60 by an input pulse of suitable amplitude applied to the core input winding. For example, when a positive pulse is applied to the external input winding 17 of the core 12, the point representing the state of the core 12 changes along the right branch of the curve 60 to saturation in the positive direction, as represented by the point B*s* of the curve 60. Upon termination of the input signal, the point representing the state of the core 12 returns along the top branch of the curve 60 to the remanent point B*r* corresponding to the set state.

The positive input signal is indicated in FIG. 1 by the positive input pulse 62 applied to the input winding 17 by the drive pulse source 41. The flux change in the core 12 induces a voltage in the base winding 13 of the transistor 15 in a direction to bias the transistor 15 further into its non-conductive condition. The voltage induced across collector winding 14 of the core 12 also applies a reverse bias across the collector-base diode of the transistor 15. Accordingly, the transistor 15 remains cut-off and substantially no current flow is produced in its emitter-to-collector path. Thus, after the input pulse 62 is ended, the first stage core 12 is in its set condition, the remaining cores 32 and 42 are in their initial reset condition, and each of the transistors 15, 25 and 35 is cut-off.

Assume now that a negative polarity input signal represented by the negative pulse 66 is applied to the input winding 17 by the drive pulse source 41. The negative input pulse 66 applies a magnetizing force to the core 12 in a direction to change it from its set condition along the left branch of the curve 60 of FIG. 2 to the saturated condition represented by the point —B*s*. As the flux in the core 12 begins changing, a voltage is induced across the base winding 13 in a direction to forward bias the transistor 15. A resulting current flows in the emitter-to-collector path of the transistor 15 and through the collector winding 14 from the unmarked to the dot terminal. The current flow in the collector winding 14 applies a further negative magnetizing force to the core 12 to aid the negative drive pulse 66. An increased forward bias is applied to the transistor 15 by the base winding 13 induced voltage. The action continues in regenerative fashion, the core 12 rapidly changing from its remanent condition B*r* to its saturated condition —B*s*. The drive pulse 66, once it initiates the regenerative action of the circuit, may be terminated.

The current flow in the emitter-collector path of the transistor 15 also flows through the input winding 26 of the second stage core 22 from the dot to the unmarked terminal, through the collector resistor 28, and through the supply source 44 to the common ground. Current flow in the input winding 26 changes the core 22 from its initial reset condition —B*r* to its saturated condition B*s* in the set state. The voltage induced in the base winding 23 at this time is in a direction to reverse bias the transistor 25 which remains cut-off.

As the flux change in the core 12 nears completion, the base winding 13 induced voltage decreases, thereby decreasing the forward bias on the transistor 15. The smaller forward bias causes the current flow in the emitter-collector path to decrease towards zero value. This action also continues in regenerative fashion with the core 12 rapidly changing from its —B*s* saturated condition to its remanent condition —B*r* in the reset state. At the terminal portion of the switching of the core 12, the current in the emitter-collector path of the transistor 15 decreases beyond zero value and overshoots in a negative direction. This overshoot current aids the core 22 of the second stage in changing from its saturated B*s* condition past its remanent condition B*r* and towards its —B*s* state. The flux change in the core 22 arising from the overshoot current now produces a voltage in the base winding 23 in a direction to forward bias the transistor 25. The transistor 25 then becomes conductive. A regenerative action then occurs with the core 22 changing from its remanent condition B*r* to its saturated condition —B*s*.

The current flow in the emitter-collector path of the transistor 25 also flows in the input winding 36 of the core 32 from its dot to its unmarked terminal. Accordingly, the core 32 changes from its —B*r* remanent condition to its saturated condition B*s*. Upon the completion of the switching of the second stage core 22, another current overshoot in a negative direction is produced thereby causing the core 32 to change from its B*s* saturated condition to its —B*s* saturated condition.

The voltage induced in the base winding 33 of the core 32 applies a forward bias to the transistor 35. The transistor 35 then becomes conductive to and changes the core 32 from its B*s* saturated condition to its —B*s* saturated condition. At this time, an output pulse appears across the output terminal 59.

Thus, the one negative drive signal 66 causes the cores 12, 22 and 32 to successively change between the opposite states of saturation, with an output pulse being produced by the delay circuit 8 when the last stage 30 core 32 changes from its B*s* to its —B*s* saturated condition. Each of the cores 12, 22 and 32 are then in their initial reset conditions.

A new set pulse 62 and a new drive pulse 66 may then be applied to the input winding 17 of the core 12 to initiate another cycle of operation of the delay circuit 8.

The timing diagram of FIG. 3 is used to indicate the relative positions of the pulses produced in the output windings 14, 24 and 34 of the cores 12, 22 and 32 during one cycle of operation. The first pulse represented by the positive, solid pulse 70 of line *a* occurs between times $t_1$ and $t_2$ when the core 12 is changing from its B*s* saturated condition to its —B*s* saturated condition. During this time the core 22 is set to the B*s* saturated state from its —B*r* state. The negative overshoot occurs between the times $t_2$ and $t_3$ when the core 12 is changing between its B*s* saturated condition towards its —B*r* condition. As described above, the negative overshoot signal causes the initiation of the switching of the second stage core 22 from its B*s* state to its —B*s* state. Between the times $t_2$ and $t_3$ the leading edge of the solid pulse 72 of line *b* of FIG. 3 appears across the output winding 24 when the core 22 changes from its B*r* remanent condition to its —B*s* saturated condition. At this time core 32 is set in its B*s* state from its —B*r* state. At later time $t_4$, the core 22 changes from its —B*s* saturated condition to its —B*r* condition. A negative overshoot appears between the times $t_4$ and $t_5$ when the core 22 is changing towards its —B*r* condition. This negative overshoot causes the initiation of the switching of the third stage 30 core 32 to the —B*s* condition.

The solid pulse 74 of line *c* of FIG. 3 is produced across the output winding 34 between the time $t_4$ and a later time $t_6$ when the core 32 changes back and forth between its saturated conditions. A negative overshoot occurs between the times $t_6$ and $t_7$ when the core 32 changes to its —B*r* condition.

For a given core and winding arrangement, the time during which any one of the transistors remains in its saturated condition is a function of the storage time of the transistor. In the present invention, the transistors are chosen to have appreciable storage times. By storage time is meant the time during which the collector current continues to flow after the base input signal is removed. Suitable transistors, for example, are 2N140 type transistors. The width of any one of the output pulses 70, 72 and 74 therefore depends upon the storage time of the transistor through which that pulse flows. Accordingly, by controlling the storage time, the width of the output pulse is controlled. The amount and decay time of the negative overshoot is a function of the bias applied to the emitter-base diode of the transistor. Therefore, the start of the following output pulses, and hence the relative spacing between the different output pulses, is controlled by controlling the negative overshoot.

The effect of collector current when the transistor is in saturation upon the storage time of a grounded emitter transistor, is illustrated by the curves of FIG. 4. A circuit arrangement for obtaining the curves is also illustrated in FIG. 4. The ordinate of the graph of FIG. 4 is scaled in units of volts applied to the collector electrode, and the abscissa is scaled in units of microseconds. The three curves of FIG. 4 represent respectively the waveshapes of three different amplitude saturating current flows in the emitter-collector path of the transistor. Each current is produced by applying a standard negative polarity pulse to the base electrode. From FIG. 4, it is seen that the storage time varies inversely with the collector current. Thus, the storage time, and hence the durations of the output pulses of FIG. 1 are controlled by varying the collector supply or by varyinng the collector resistance. The decay portions of the curves of FIG. 4 fall more rapidly in the circuit of FIG. 1 due to the non-linear cores used with the transistors. However, the spread between the storage times still exists by a proportional amount.

In the circuit of FIG. 1, therefore, the durations of the output pulses can be increased by adjusting the collector resistors 18, 28 and 38 to reduce the collector saturation current. The positive, dotted pulses 80, 81 and 82 of lines *a*, *b* and *c* of FIG. 2 indicate the longer duration output pulses from the delay circuit 8. The variable collector resistors 18, 28 and 38 provide independent control of the output pulses. The potential of the common supply source 44 also may be varied to vary the durations of all of the output pulses by a corresponding amount.

The storage time of the transistors 15, 25 and 35 also can be controlled by applying a reverse bias across their emitter-base diodes. The curves of FIG. 5 are taken for a single transistor connected as a grounded emitter and illustrating the variation in storage time for different values of reverse bias. In FIG. 5, reverse bias potential is plotted in units of volts along the ordinate, and the storage time is plotted in units of microseconds along the abscissa. The four waveforms of FIG. 5 respectively represent four values 100, 60, 15 and 0 microamperes ($\mu$a.) of base current flow produced by a standard base input pulse for different values of reverse bias. It is seen from the curves of FIG. 5, that the higher the reverse bias, the shorter the storage time for a given saturation current. This base current flow corresponds to the collector base current of the saturated transistor. Thus, the larger the reverse bias, the shorter the duration of the output pulse.

In the system of FIG. 1, the reverse bias is controlled by varying the common emitter resistor 56 to vary the durations of the output pulses by a corresponding amount. The reverse bias of the transistors 15, 25 and 35 also can be controlled by connecting separate bias sources, not shown, between the unmarked terminals of the base windings 13, 23 and 33 and the common ground. The negative overshoot pulses shown in the timing diagrams of FIG. 3 aid in controlling the switching of the succeeding core in the delay circuit 8. The amount of overshoot can be varied by controlling the storage time of the different transistors 15, 25 and 35 as by adjusting the collector and emitter resistors. Thus, the relative spacing between successive output pulses can be controlled, as indicated by the increased spacing between the dotted output pulses 80, 81 and 82 of FIG. 3.

In a ring counter type operation, the movable arm of the single-pole, double-throw switch 50 of FIG. 1 is connected to the upper fixed terminal 51 to connect the collector winding 34 of the last stage 30 to the second input winding 16 of the first stage 10. Thus, once a cycle of positive and negative pulses 62 and 66 are applied to set and then reset the core 12, a continuous series of pulses circulate around the closed ring. Successive output pulses are separated from each other by a given amount determined by the number of stages in the ring and the storage times of these stages.

Figure 6:
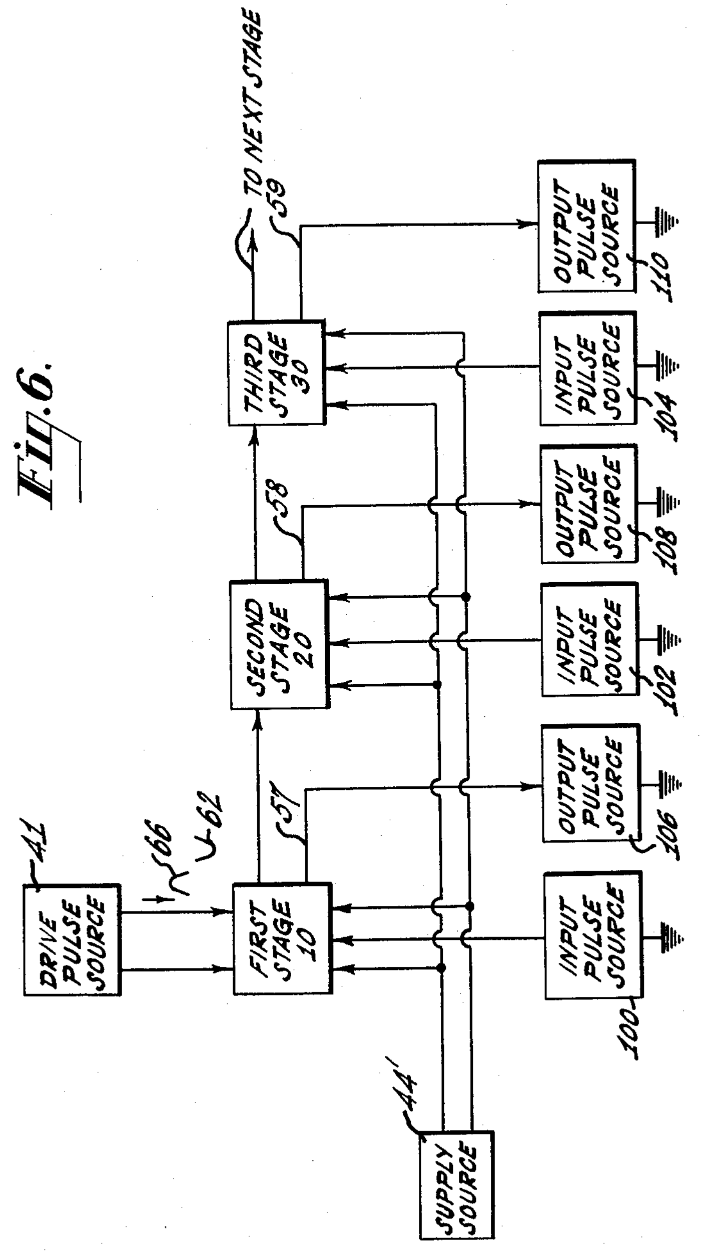
FIG. 6 is a schematic diagram of a delay circuit according to the invention used as a converter circuit.

The delay circuit also may be employed as a converter to change pulse amplitude modulated signals (PAM) to pulse width (PWM) or duration (PDM) modulated signals as indicated in FIG. 6. The circuit of FIG. 6 is similar to the circuit of FIG. 1 except that the unmarked terminals of the base windings 13, 23 and 33 are connected respectively to the outputs of three input pulse sources 100, 102 and 104. The common emitter resistor 56 may be part of the supply source 44' of FIG. 6. The output terminals 57, 58, and 59 of the three transistors 15, 25, and 35 are connected respectively to three output devices 106, 108 and 110. Thus, a pulse amplitude modulated input pulse from an input source varies the storage time of the associated transistor by a given amount proportional to the input pulse amplitude. The duration of the any one output pulse corresponds to the amplitude of the input pulse from the associated input source. As many input and output devices as desired may be cascaded by providing a separate stage for each input and output source pair.

There have been described herein improved delay circuits which operate to provide one or more output signals whose durations and relative spacing are simply and accurately controlled. Various applications are described for the delay circuits, among which are timing, commutating, counting, and converting applications. The transistors may be of the PNP type as shown, or of the NPN type by suitably poling the various sources.

What is claimed is:

1. A delay circuit comprising a plurality of cores of rectangular loop material arranged in ordered fashion, a like plurality of transistor devices each having base, emitter and collector electrodes, said transistors being changed between their cut-off and saturated conditions by base input signals, and each said transistor exhibiting a storage time during which said saturated condition is maintained after said base input signal is removed, said cores each having base, collector and input windings linked thereto, said base and collector windings of any one core being connected in regenerative fashion to a different one of said transistors, said collector winding of any one core being connected to the input winding of the next succeeding one of said cores, and means for controlling the said storage times of said transistors.

2. A delay circuit as claimed in claim 1, said transistors each being normally cut-off in the absence of a forward bias applied between their emitter and base electrodes, and means for applying varying amounts of forward bias to said transistors.

3. A delay circuit as claimed in claim 1, including a common emitter resistor connected to all said emitter electrodes.

4. A delay circuit as claimed in claim 1, including means connecting the said collector winding of the last one of said cores to the input winding of the first one of said cores.

5. A delay circuit comprising a plurality of cores of rectangular loop material arranged in ordered fashion, a plurality of transistor devices each having base, collector and emitter electrodes, said transistors being changed between their cut-off and saturated conditions by base input signals, and any one of said transistors having a storage time in which said saturated condition is maintained after said base input signal is removed, said cores each having base, emitter and collector windings linked thereto, a plurality of collector resistors, a supply source, said base and collector winding of any one core being connected in regenerative fashion to a different one of said transistors, said collector winding of any one core being connected in series with the input winding of the next succeeding one of said cores and a different one of said collector resistors to said supply source, and means including said collector resistors for controlling the said storage times of said transistors.

6. A delay circuit as claimed in claim 5, including a common emitter resistor connecting all said emitter electrodes to a common reference potential, said supply source having a terminal connected to said reference potential.

7. A delay circuit as claimed in claim 5, said collector winding of the last one of said cores being connected to the said input winding of the first one of said cores.

8. A delay circuit comprising a plurality of cores of rectangular loop material arranged in ordered fashion, a like plurality of transistor devices each having base, emitter and collector electrodes, said transistors being changed between their cut-off and saturated conditions by base input signals, and each said transistor exhibiting a storage time during which said saturated condition is maintained after said base input signal is removed, said cores each having base, input and collector windings linked thereto, said base and collector windings of any one core being connected in regenerative fashion to a different one of said transistors, said collector winding of any one core being connected to the input winding of the next succeeding one of said cores, a plurality of input sources each connected in series with a different said base winding to the base electrode of a different said transistor, and a plurality of output devices each connected across the collector and emitter electrodes of a different said transistor.

9. A delay circuit as claimed in claim 5, including means for controlling the said storage times of said transistors.

10. A delay circuit as claimed in claim 5, any one of said input pulse sources applying varying amounts of reverse bias to its connected transistor to vary the said storage time of that transistor.

11. A delay circuit as claimed in claim 5, including a plurality of collector resistors and a supply source, said collector winding of any one core being connected to the input winding of the next succeeding one of said cores and a different said collector resistor to said supply source, said collector resistors being variable to control the said storage times of said transistors.

References Cited in the file of this patent

UNITED STATES PATENTS

| | | |
|---|---|---|
| 2,763,780 | Skelton et al. | Sept. 18, 1956 |
| 2,772,370 | Bruce et al. | Nov. 27, 1956 |
| 2,787,717 | Kasmir | Apr. 2, 1957 |
| 2,906,892 | Jones | Sept. 29, 1959 |